US011977044B2

(12) United States Patent
Saraf

(10) Patent No.: US 11,977,044 B2
(45) Date of Patent: May 7, 2024

(54) HIGH LINEAR RANGE HUMIDITY SENSOR

(71) Applicant: Murata Manufacturing Co., Ltd., Kyoto (JP)

(72) Inventor: Vivek Saraf, Austin, TX (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 17/176,972

(22) Filed: Feb. 16, 2021

(65) Prior Publication Data

US 2022/0260515 A1    Aug. 18, 2022

(51) Int. Cl.
*G01N 27/22* (2006.01)
*H01L 23/29* (2006.01)
*H01L 23/64* (2006.01)

(52) U.S. Cl.
CPC ......... *G01N 27/223* (2013.01); *G01N 27/228* (2013.01); *H01L 23/29* (2013.01); *H01L 23/642* (2013.01)

(58) Field of Classification Search
CPC .... G01N 27/223; G01N 27/228; H01L 23/29; H01L 23/642
See application file for complete search history.

(56) References Cited

U.S. PATENT DOCUMENTS

| 5,098,196 | A   | 3/1992  | O'Neill |
|-----------|-----|---------|---------|
| 8,554,389 | B2* | 10/2013 | Cox ...................... G06F 1/3203 320/144 |
| 9,164,052 | B1  | 10/2015 | Speer et al. |
| 11,761,936 | B2 | 9/2023  | Saraf et al. |
| 2006/0210427 | A1* | 9/2006 | Theil ...................... G01N 31/00 422/83 |
| 2009/0015316 | A1 | 1/2009 | Song et al. |

(Continued)

FOREIGN PATENT DOCUMENTS

DE         10335553 A1 *  2/2005  ........... G01N 27/223
WO   WO-2017122178 A1 *  7/2017  ............... A61B 5/01

OTHER PUBLICATIONS

Semi Corporation, "Compact Humidity and Pressure Sensor with Temperature Control", provisional application filed in the USPTO dated Mar. 9, 2020, U.S. Appl. No. 62/987,245, 33 pgs.

(Continued)

*Primary Examiner* — Alexander Satanovsky
*Assistant Examiner* — Asm Fakhruddin
(74) *Attorney, Agent, or Firm* — JAQUEZ LAND GREENHAUS & McFARLAND LLP; John Land, Esq.

(57) ABSTRACT

Circuits and methods for extending the linear range of IC-based environmental sensors. The IC-based environmental sensors may sense environmental characteristic such as humidity levels, the presence and/or concentration of specific chemicals, and/or the presence and/or concentration of specific biological molecules. The linearity of an environmental sensor can be extended by heating the sensor within a range of non-linear operation to artificially induce the sensor to operate within its linear range, and then accurately measuring, either directly or indirectly, the temperature rise caused by such heating. A correction factor is then determined based on the measured temperature rise that is combined with measurements from the sensor while operating within its non-linear range in order to generate an accurate estimate of an actual environmental characteristic.

20 Claims, 10 Drawing Sheets

(56) References Cited

U.S. PATENT DOCUMENTS

| | | | |
|---|---|---|---|
| 2011/0125204 A1* | 5/2011 | Louise | A61N 1/36014 607/3 |
| 2011/0226041 A1 | 9/2011 | Cummins | |
| 2012/0168882 A1* | 7/2012 | Cherian | G01N 33/48785 257/E27.122 |
| 2013/0139587 A1* | 6/2013 | Le Neel | G01N 27/223 216/13 |
| 2014/0216153 A1* | 8/2014 | Pion | G01N 27/048 73/335.04 |
| 2014/0291677 A1 | 10/2014 | Le Neel et al. | |
| 2016/0347606 A1 | 12/2016 | Bruno | |
| 2021/0278385 A1 | 9/2021 | Saraf et al. | |

OTHER PUBLICATIONS

Semi Corporation, "Compact Humidity and Pressure Sensor with Temperature Control", patent application filed in the USPTO dated Mar. 8, 2021, U.S. Appl. No. 62/987,245 U.S. Appl. No. 17/195,027, 37 pgs.

Luukkonen, Kirsi, International Search Report and Written Opinion received from the EPO dated Aug. 23, 2021 for appln. No. US/2021/021385, 22 pgs.

Dai, et al., "A Capacitive Humidity Sensor Integrated with Micro Heater and Ring Oscillator Circuit Fabricated by CMOS-MEMS Technique", Sensors and Actuators B: Chemical, Elsevier Bv. Nl, vol. 122, No. 2, Mar. 15, 2007, pp. 375-380.

Igarashi, et al., "A Cryostat and Temperature Control System Optimized for Measuring Relaxations of Glass-Forming Liquids", Review of Scientific Instruments, AIP, Melville, NY, US, vol. 79, No. 4, Apr. 11, 2008, p. 45105.

Bota, et al., "A Monolithic Interface Circuit for Gas Sensor Arrays: Control and Measurement", Analog Integrated Circuits and Signal Processing, Kluwer Academic Publishers, BO, vol. 40, No. 2, Aug. 1, 2004, pp. 175-184.

Minco, "CT298 HeaterStat Temperature Controller", , URL:https://www.minco.com/wp-content/uploads/CT298-User-Guide.pdf, Jan. 1, 14, pp. 1-12.

Niedermeyr, Gabriela, Invitation to Pay Additional Fees received from the EPO dated May 28, 2021 for appln. No. PCT/US2021/021385, 14 pgs.

Roberts, Herbert K., Office Action received from the USPTO dated Dec. 5, 2022 for U.S. Appl. No. 17/195,027, 7 pgs.

Roberts, Herbert K., Office Action received from the USPTO dated Feb. 13, 2023 for U.S. Appl. No. 17/195,027, 37 pgs.

Roberts, Herbert K., Notice of Allowance received from the USPTO dated May 9, 2023 for U.S. Appl. No. 17/195,027, 11 pgs.

* cited by examiner

HIGH LINEAR RANGE HUMIDITY SENSOR

CROSS-REFERENCE TO RELATED APPLICATIONS

This invention may be related to the following patent application, assigned to the assignee of the present invention, the contents of which are incorporated by reference: U.S. Provisional Patent Application Ser. No. 62/987,245, filed Mar. 3, 2020, entitled "Compact Humidity and Pressure Sensor with Temperature Control".

BACKGROUND

(1) Technical Field

This invention relates to integrated circuit (IC) electronic circuits and environmental sensors, particularly humidity sensors.

(2) Background

An integrated circuit (IC) die that includes a humidity sensor may be used, for example, as an environment monitor in "smart" cellphones and watches, thermostats, heating/ventilating/air conditioning systems (HVAC systems), automobiles, refrigerators, and other applications where knowledge of humidity levels is useful.

FIG. 1 is a stylized cross-sectional view of an IC die 100 that includes an integrated humidity sensor. (Note that the dimensions for the various elements in FIG. 1 are not to scale; some dimensions have been greatly exaggerated vertically and/or horizontally for clarity or emphasis). A substrate 102, such as a silicon or silicon-on-insulator (SOI) wafer, supports a primary circuit layer 104 formed during a front-end-of-line (FEOL) processing stage. As is known in the art, the FEOL processing stage is the first portion of IC fabrication where individual active devices (e.g., transistors) and some passive devices (e.g., capacitors, resistors, etc.) are patterned on or in the primary circuit layer 104 on the substrate 102. The FEOL processing stage generally covers everything up to the deposition of metal interconnect layers. After the last step of the FEOL processing stage, the result is a wafer with isolated transistors (i.e., without any wiring connections).

The second portion of IC fabrication is the back-end-of-line (BEOL) processing stage, in which the individual devices on the primary circuit layer 104 are interconnected with conductive wiring or traces. A superstructure 106 is formed on the primary circuit layer 104 during the BEOL processing stage. As is known in the art, the superstructure 106 includes contacts, insulating layers (dielectrics), metal layers, vias, some passive devices (e.g., inductors, capacitors, resistors, etc.), and bonding sites for chip-to-package connections.

In the illustrated embodiment, a surface layer 108 is formed on the superstructure 106 during the BEOL processing stage. Some BEOL fabrication processes include application of a redistribution layer (RDL), which is generally an extra metal layer on an IC die that makes the input/output (I/O) pads of an IC die available to be coupled to other locations of the die, and/or to another IC die, and/or to specialized packing structures. The RDL (not shown) may be formed on the superstructure 106, or in some cases (for example, for single-layer transfer chip structures) adjacent to the primary circuit layer 104 after removal of the original substrate 102 and re-attachment of the primary circuit layer 104 and superstructure 106 to a handle wafer (not shown). For purposes of this disclosure, an RDL is considered to be part of the surface layer 108.

A portion of the surface layer 108 includes a first capacitor terminal 110 and a second capacitor terminal 112. Both of the capacitor terminals 110, 112 may be formed of a conductor (e.g., aluminum, copper, conductive polymer, etc.) configured to form two electrodes ("plates") of a capacitor. The capacitor terminals 110, 112 may be fabricated out of part of the RDL formed during a BEOL processing stage, and may be configured as three-dimensional structures, such as parallel conductor strips, or as a set of interdigitated "comb" like structures, or as concentric circles, etc., in spaced relationship with respect to each other. The dimensions of the capacitor terminals 110, 112, and/or the spacing between the capacitor terminals 110, 112, may be optimally chosen by modeling and/or fabricating test ICs to maximize signal to noise ratio for data conversion circuitry (see below), and/or to optimize key performance parameters of a humidity sensor.

Each of the first capacitor terminal 110 and the second capacitor terminal 112 would generally be coupled to conductive pads or wiring traces on or within the superstructure 106, and thence to circuitry formed in the primary circuit layer 104. An advantage of forming the capacitor terminals 110, 112 as part of the RDL is that, at least for a standard CMOS fabrication process, formation of the capacitor terminals 110, 112 requires no additional masks or process steps, and therefore no additional cost.

One added step would be the deposition and, optionally, shaping, of a humidity-sensitive dielectric material 114 between, and optionally around, the capacitor terminals 110, 112. The deposition and optional shaping of such materials is well known in the art. The first capacitor terminal 110, the humidity-sensitive dielectric material 114, and the second capacitor terminal 112 form a capacitor structure 116 (within the dashed box). Useful capacitance results from parallel plate and fringe capacitance through the humidity-sensitive dielectric material 114. For example, in the illustrated example, applying a voltage across the first capacitor terminal 110 and the second capacitor terminal 112 results in a parallel electric field between the capacitor terminals 110, 112 (indicated by the straight dotted lines in FIG. 1) and a fringe electric field between the capacitor terminals 110, 112 (indicated by the curved dotted lines in FIG. 1).

The humidity-sensitive dielectric material 114 should, in response to varying environmental moisture levels, cause a measurable change in capacitance and/or electrical charge within the capacitor structure 116. In essence, absorption of moisture in the humidity-sensitive dielectric material 114 changes the electric field between the capacitor terminals 110, 112. An example of a humidity-sensitive dielectric material 114 is a polymer such as a polyimide, which has a dielectric constant that varies as a function of humidity.

A problem with current IC-based humidity sensors is a lack of linearity at high humidity levels (e.g., >80%). For example, FIG. 2 is a graph 200 of measured humidity versus ambient humidity for a typical prior art IC-based humidity sensor. Graph line 202 shows an ideal linear humidity sensor response from 50% to 100% humidity. Graph line 204 shows a non-ideal humidity sensor response.

Accordingly, there is a need to extend the linear range of an IC-based humidity sensor to high humidity levels. It would also be useful if the linearity of IC-based sensors for other environmental characteristics (e.g., the presence and/ or concentration of specific chemical or biological molecules) could be extended. The present invention addresses these needs and desires.

SUMMARY

The present invention encompasses circuits and methods for extending the linear range of IC-based environmental sensors. The IC-based environmental sensors may sense environmental characteristic such as humidity levels, the presence and/or concentration of specific chemicals, and/or the presence and/or concentration of specific biological molecules.

In some embodiments, the linearity of an environmental sensor can be extended by heating the sensor within a range of non-linear operation to artificially induce the sensor to operate within its linear range, and then accurately measuring, either directly or indirectly, the temperature rise caused by such heating. A correction factor is then determined based on the measured temperature rise that is combined with measurements from the sensor while operating within its non-linear range in order to generate an accurate estimate of an actual environmental characteristic.

Embodiments of the present invention can measure temperature rise around the terminals (plates) of a capacitance-based environmental sensor in two ways. The first approach is to directly measure the temperature at the level of the capacitor terminals on a real-time basis. The second approach is to directly measure the temperature at the level (i.e., same IC layer) of the capacitor terminals during characterization of IC samples of a particular IC design (a local measurement with respect to the capacitor terminals) while directly measuring the temperature of the IC at the primary circuit layer and/or the superstructure level (a remote measurement with respect to the capacitor terminals), and essentially mapping the difference between the local measurements and the remote measurements by way of, for example, curve fitting or a look-up table (LUT). Thereafter, during IC operation, measuring the remote temperature in real-time can be used to accurately estimate the local temperature at the level of the capacitor terminals based on the characterized difference (that is, direct measurement of the temperature at the level of the capacitor terminals is not required during IC operation).

One embodiment includes an integrated circuit die including an environmental sensor having a linear measurement range and a non-linear measurement range; a heating element positioned to initiate heating of the environmental sensor at least while the environmental sensor is operating in the non-linear measurement range; a temperature sensor positioned to measure an increase in temperature of the environmental sensor; and circuitry, coupled to the temperature sensor and the environmental sensor, configured to correct, as a function of measured increase in temperature of the environmental sensor, measurements of an environmental characteristic by the environmental sensor while the environmental sensor is operating in the non-linear measurement range The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods for extending the linear range of IC-based environmental sensors. The IC-based environmental sensors may sense environmental characteristic such as humidity levels, the presence and/or concentration of specific chemicals, and/or the presence and/or concentration of specific biological molecules.

Figure 3:
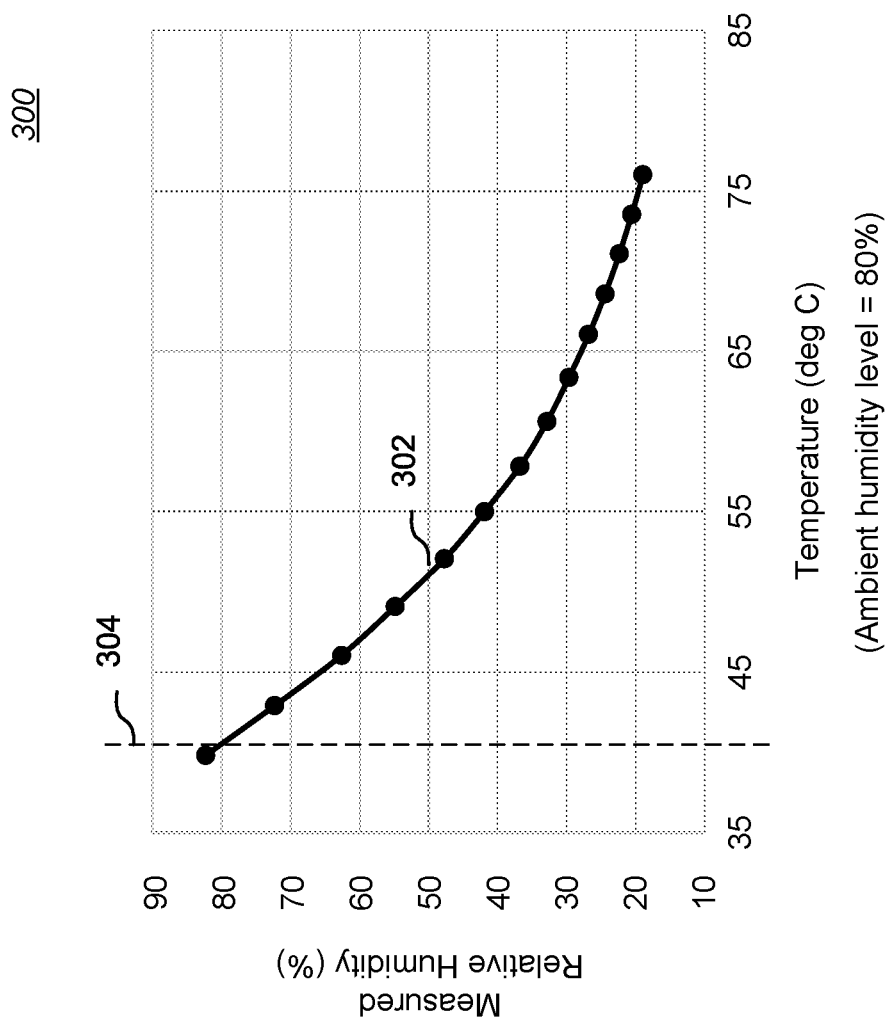
FIG. 3 is a graph showing measurements in one embodiment of an IC-based humidity sensor of relative humidity as a function of temperature at an ambient humidity level of 80%.

With respect to IC-based humidity sensors, an aspect of the present invention is the recognition that measurements of relative humidity are a function of temperature. As a rule of thumb, humidity drops by about 5% for every 1° C. rise in temperature, which can be determined more accurately for a particular IC design by characterization of IC samples. For example, FIG. 3 is a graph 300 showing measurements in one embodiment of an IC-based humidity sensor of relative humidity as a function of temperature at an ambient humidity level of 80%. As graph line 302 shows, the sensor measures 80% relative humidity (matching the actual ambient humidity) at a temperature of about 41° C. (see dashed line 304). As temperature increases, the sensor reports a lower relative humidity despite lack of change in the ambient humidity. Graph line 302 closely follows an exponential curve that can usefully characterize the humidity-temperature response of the IC-based humidity sensor, and in general is independent of the sensor.

Figure 2:
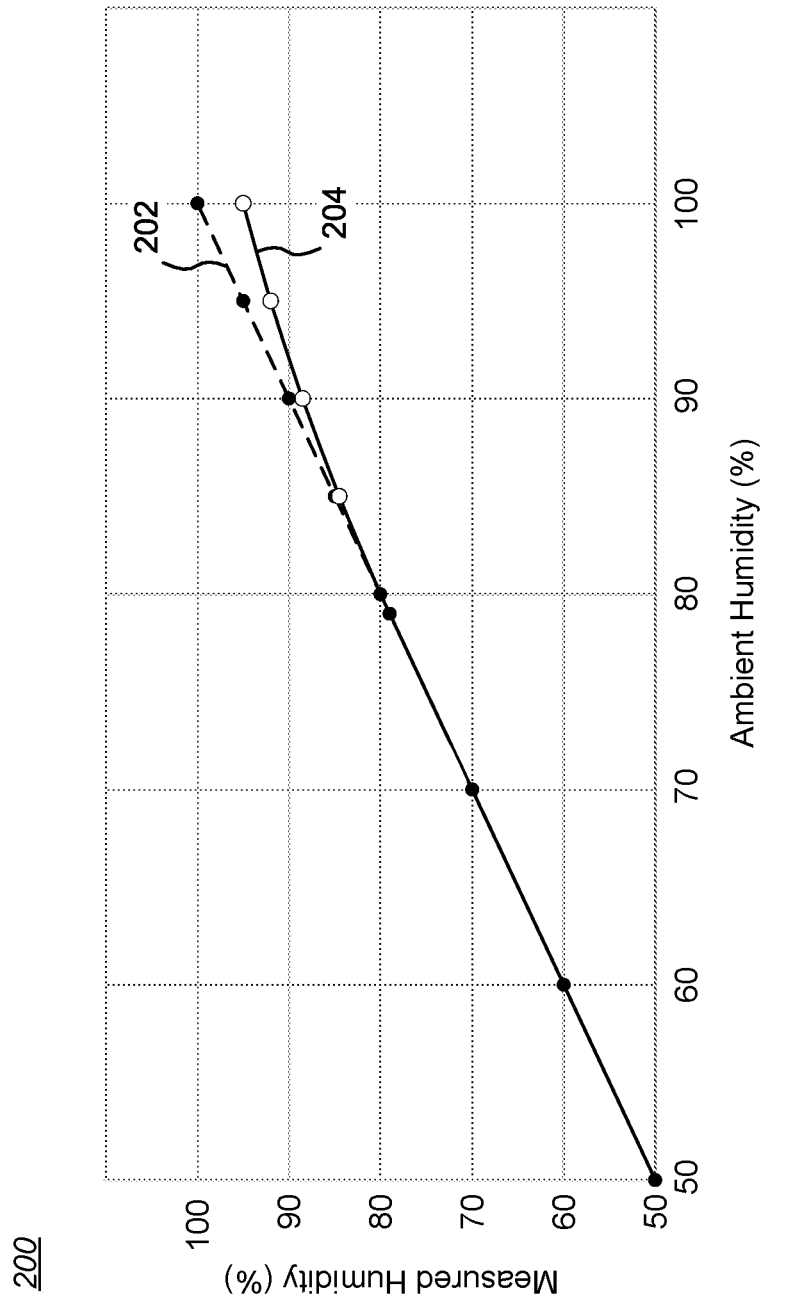
FIG. 2 is a graph of measured humidity versus ambient humidity for a typical prior art IC-based humidity sensor.
Figure 4:
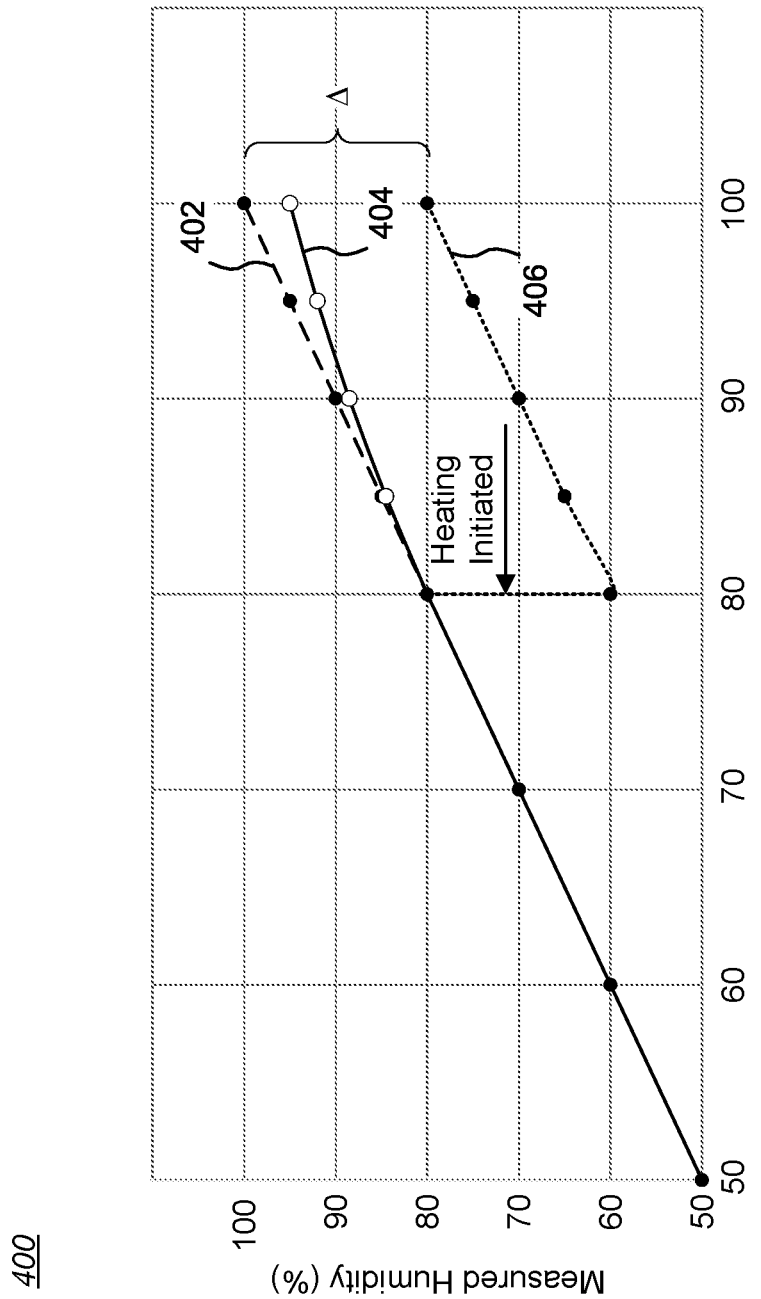
FIG. 4 is a graph of measured humidity versus ambient humidity over a range of 50%-100%, with an added temperature-based offset for ambient humidity levels at or above about 80%.

The relationship of measured humidity to variations in temperature may be usefully applied to correct the non-linearity shown in FIG. 2. For example, FIG. 4 is a graph 400 of measured humidity versus ambient humidity over a range of 50%-100%, with an added temperature-based offset for ambient humidity levels at or above about 80%. Graph line 402 shows an ideal linear humidity sensor response from 50% to 100% humidity. Graph line 404 shows that, starting at about the 80% ambient humidity level, the humidity as reported by the measuring humidity sensor is less than the actual ambient humidity. Graph line 406 shows that the effect of increasing the temperature of the measuring humidity sensor decreases the reported humidity by an offset amount A. In effect, the heated humidity sensor behaves as if it is measuring ambient humidity from 60% to 80%—within the humidity sensor's linear range—while the actual ambient humidity is in the 80% to 100% range. Thus, if the amount of temperature increase of the humidity sensor is known, an offset to the measured humidity value can be calculated to yield a value that represents the ambient humidity.

The concepts shown in FIG. 4 apply more generally to IC-based capacitive sensors configured with a dielectric material that can respond to the presence and/or concentration of specific chemicals and/or the presence and/or concentration of specific biological molecules, where the linearity of the sensors can be extended by heating the sensor within some range of operation.

Note also that there may cases where the concepts shown in FIG. 4 could extend the low end of a sensor using a similar but inverted technique. The inverted technique would enable the heater when operating in the middle of the sensor range, then disabling the heater at the low end of the sensor range. While this does not help extend the range of known humidity sensors (since such sensors would need to be cooled rather than heated when operating at the low range), there may be cases where the sensor itself or a different type of sensor and environmentally sensitive dielectric material would favorably respond to this inverted technique.

To implement the concepts shown in FIG. 4, an IC-based capacitive environmental sensor needs a means of heating an area around or near the capacitive electrodes of the sensor, and circuitry to accurately measure the temperature rise caused by the heating apparatus.

Heating Elements

Figure 1:
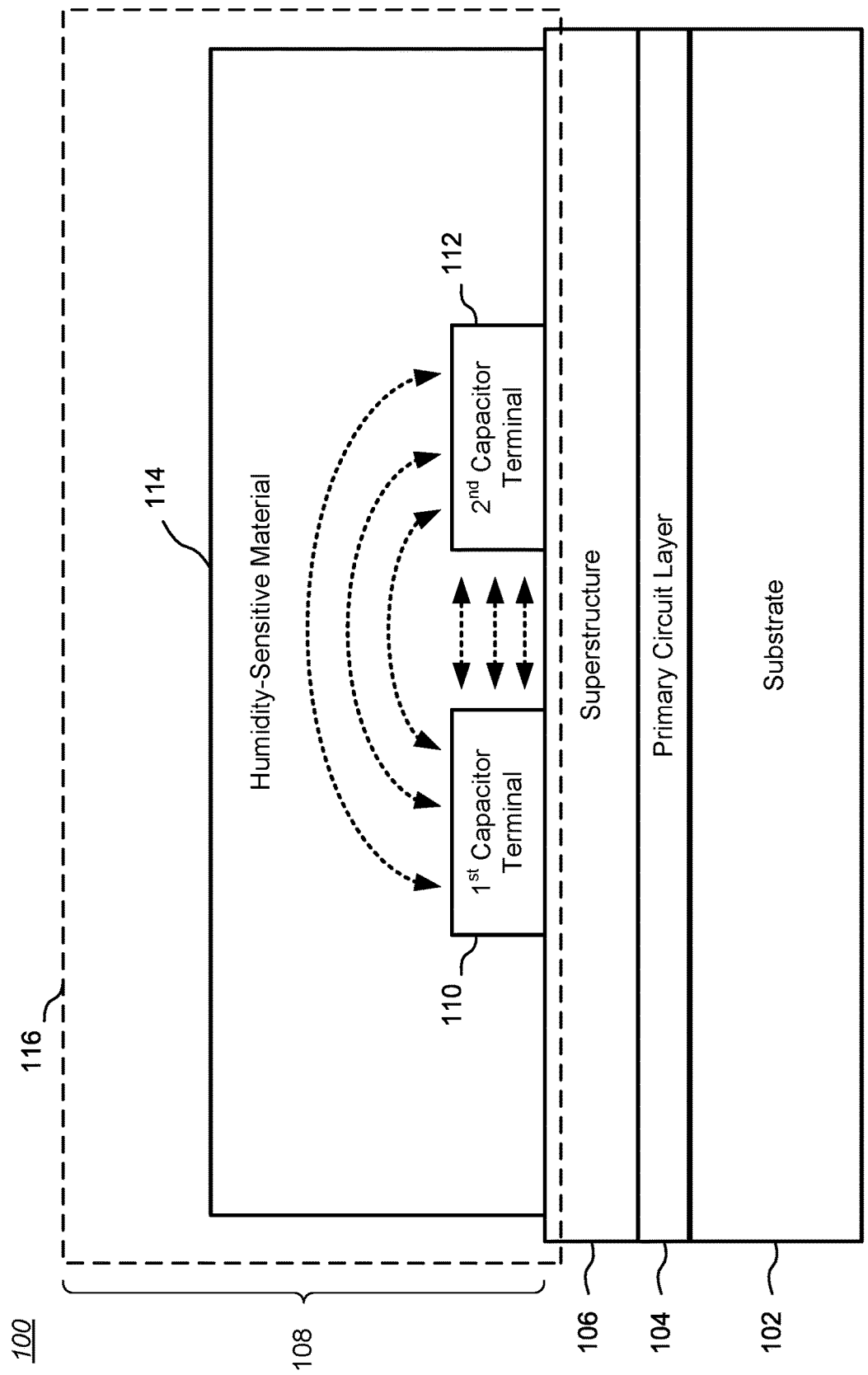
FIG. 1 is a stylized cross-sectional view of an IC die that includes an integrated humidity sensor.
Figure 5:
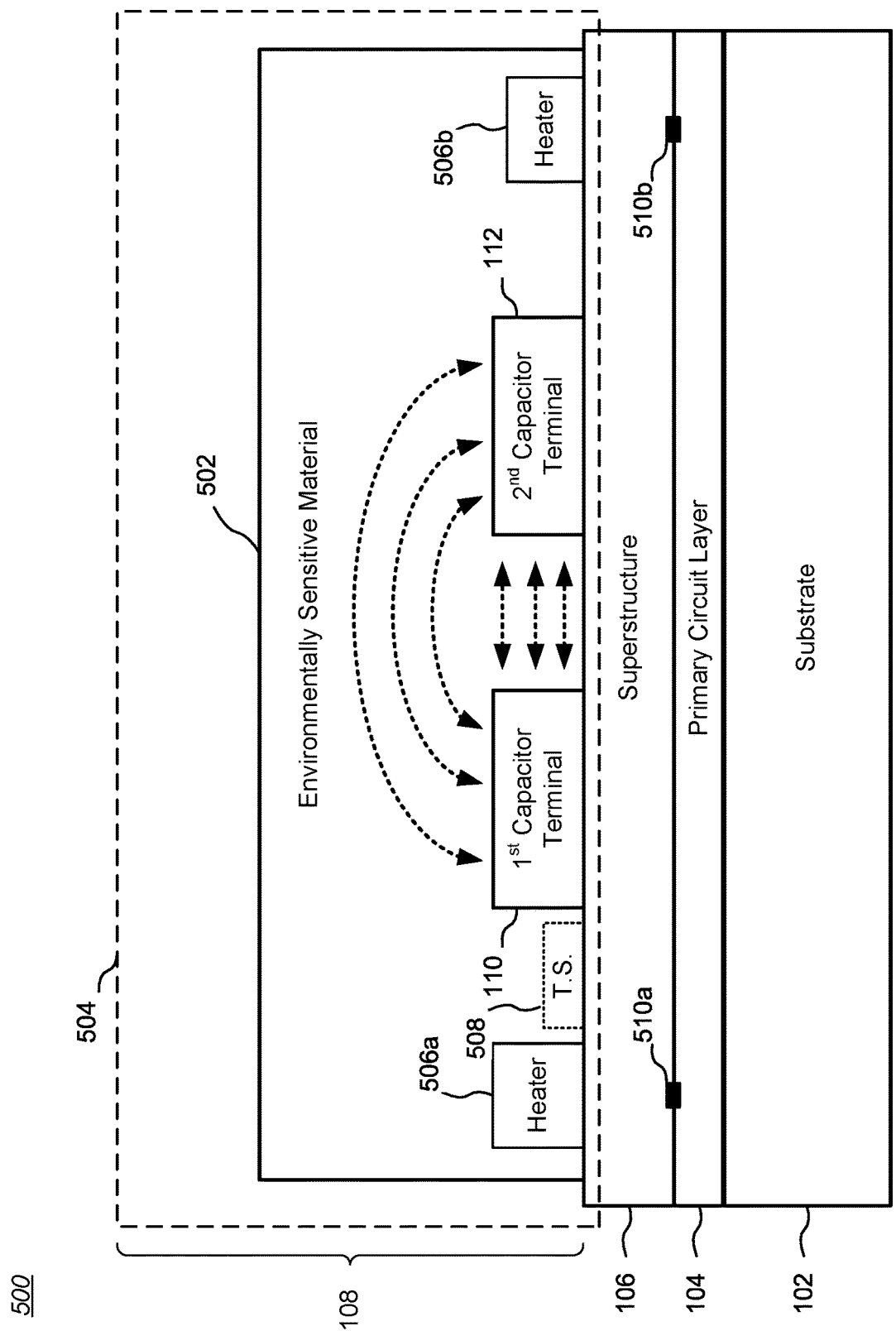
FIG. 5 is a stylized cross-sectional view of an IC die that includes an integrated capacitor-based environmental sensor and one or more heating elements.

FIG. 5 is a stylized cross-sectional view of an IC die 500 that includes an integrated capacitor-based environmental sensor and one or more heating elements. (Note again that the dimensions for the various elements in FIG. 5 are not to scale; some dimensions have been greatly exaggerated vertically and/or horizontally for clarity or emphasis). Much of the IC structure is similar to the IC die 100 of FIG. 1. However, an environmentally-sensitive dielectric material 502 is formed between, and optionally around, the capacitor terminals 110, 112. The deposition and optional shaping of such materials is well known in the art. The first capacitor terminal 110, the environmentally-sensitive dielectric material 502, and the second capacitor terminal 112 form a capacitor structure 504 (within the dashed box) that responds to an environmental condition, such as humidity level, specific biological molecules, and/or specific chemicals. The environmentally-sensitive dielectric material 502 should also be sensitive to temperature changes, such that heating the environmentally-sensitive dielectric material 502 changes the response of the capacitor structure 504.

In addition, one or more heating elements 506a, 506b have been added at the same level—that is, IC layer—as the capacitor terminals 110, 112, and generally at the same time using the same or similar fabrication process. Fabricating heating elements 506a, 506b at the same level of IC interconnections (e.g., a metal layer) as the capacitor terminals 110, 112 allows heat to be distributed substantially uniformly across the capacitor terminals 110, 112. In the illustrated example, two heating elements 506a, 506b are shown. The heating elements 506a, 506b may be implemented, for example, as resistors. Preferably, the resistors exhibit a resistance value that is essentially linear over a specified temperature range (e.g., about 5° C. to about 70° C.); such linearity is readily available in IC resistive elements. As described in greater detail below, the heating elements 506a, 506b generally would be coupled to control circuitry for initiating heating of the nearby capacitor terminals 110, 112 and for maintaining a set heat level (see FIG. 9). As a side benefit, in a humidity sensor embodiment, the heating elements 506a, 506b also may be used to increase temperature around the capacitor terminals 110, 112 to beyond the dew point, thereby evaporating any water on or near the capacitor terminals 110, 112 (e.g., from immersion of the circuit in water) and allowing the humidity sensor to resume normal functioning.

It should be appreciated that FIG. 5 is a cross-sectional view. As noted above, the capacitor terminals 110, 112 may be fabricated out of part of the RDL formed during a BEOL processing stage, and may be configured as three-dimensional structures, such as parallel conductor strips, or as a set of interdigitated "comb" like structures, or as concentric circles, etc., in spaced relationship with respect to each other. The dimensions of the capacitor terminals 110, 112, and/or the spacing between the capacitor terminals 110, 112, may be optimally chosen by modeling and/or fabricating test ICs to maximize signal to noise ratio for data conversion circuitry (see FIGS. 8 and 9 below), and/or to optimize key performance parameters of an environmental sensor. Similarly, the heating elements 506a, 506b may be fabricated out of part of the RDL formed during a BEOL processing stage, and may be configured as three-dimensional structures located near, around, and/or in-between the capacitor terminals 110, 112.

Temperature Sensors

In addition to the added heating elements 506a, 506b, a second requisite for implementing the concepts shown in FIG. 4 is an apparatus for accurately measuring the temperature rise caused by the heating elements 506a, 506b in order to properly compensate the final result. Embodiments of the present invention can measure that temperature rise in two ways. The first approach is to directly measure the temperature at the level (i.e., same IC layer) of the capacitor terminals 110, 112 on a real-time basis. The second approach is to directly measure the temperature at the level of the capacitor terminals 110, 112 during characterization of IC samples of a particular IC design (a local measurement with respect to the capacitor terminals 110, 112) while directly measuring the temperature of the IC at the primary circuit layer 104 and/or in the superstructure 106 (a remote measurement with respect to the capacitor terminals 110, 112), and essentially mapping the difference between the local measurements and the remote measurements by way of, for example, curve fitting or a look-up table (LUT). Thereafter, during IC operation, measuring the remote temperature in real-time can be used to accurately estimate the local temperature at the level of the capacitor terminals 110, 112 based on the characterized difference (that is, direct measurement of the temperature at the level of the capacitor terminals 110, 112 is not required during IC operation).

A. Heating Elements as Temperature Sensors

In a first embodiment, the heating elements 506a, 506b are resistors, and the temperature at the local level may be directly measured in real time during IC operation by measuring the supply current through and the voltage across the heating elements 506a, 506b, in known fashion, to determine the resistance level of the heating elements 506a, 506b (using R=V/I). Since the heating elements 506a, 506b are selected to exhibit a known linear relationship between resistance and temperature, the local temperature may be readily determined from the measured resistance level.

From a measured local temperature and a known transition point from linear to non-linear behavior of the capacitor structure 504 (e.g., at about 80% humidity for a capacitor-based humidity sensor), a selected amount of added heat may be applied around the capacitor terminals 110, 112. While FIG. 4 shows a constant offset amount A, indicating that a constant amount of heat was applied in that example after the measured humidity reached 80%, the amount of heat applied by the heating elements 506a, 506b may be calibrated to be a function of the characterized non-linearity of the capacitor-based environmental sensor. For example, referring to FIG. 4, a first amount of heat may be applied when the measured humidity (after heating has been initiated) is in the 60% to 70% range (corresponding to an ambient humidity of 80% to 90%), and a second amount of heat may be applied when the measured humidity (after heating has been initiated) is in the 70% to 80% range (corresponding to an ambient humidity of 90% to 100%). In other embodiments, the number of steps for heat increases/decreases may be more than two.

B. Local Temperature Sensors

In a second embodiment, rather than utilize the resistive heating elements 506a, 506b as temperature sensors, one or more temperature sensors may be used at the local level of the capacitor terminals 110, 112 to directly measure temperature in real time during IC operation. For example, in FIG. 5, a local temperature sensor 508 may be fabricated (e.g., in the RDL) as a small resistor at the level of the capacitor terminals 110, 112. Using a small resistor as a local temperature sensor 508 requires less current than the heating elements 506a, 506b when used as a temperature sensor. Since small local temperature sensors 508 generally would require less current, they can be realized using much thinner electrodes, which would allow more of them and more widespread distribution across the breadth of the humidity sensor, in turn allowing heating to be more uniform. The temperature at the local level may be directly measured in real time by measuring the supply current through and the voltage across the local temperature sensor 508, in known fashion, to determine the resistance level of the local temperature sensor 508 (again, using R=V/I). Given a known linear relationship between resistance and temperature for the local temperature sensor 508, the local temperature may be readily determined from the measured resistance level.

Figure 6:
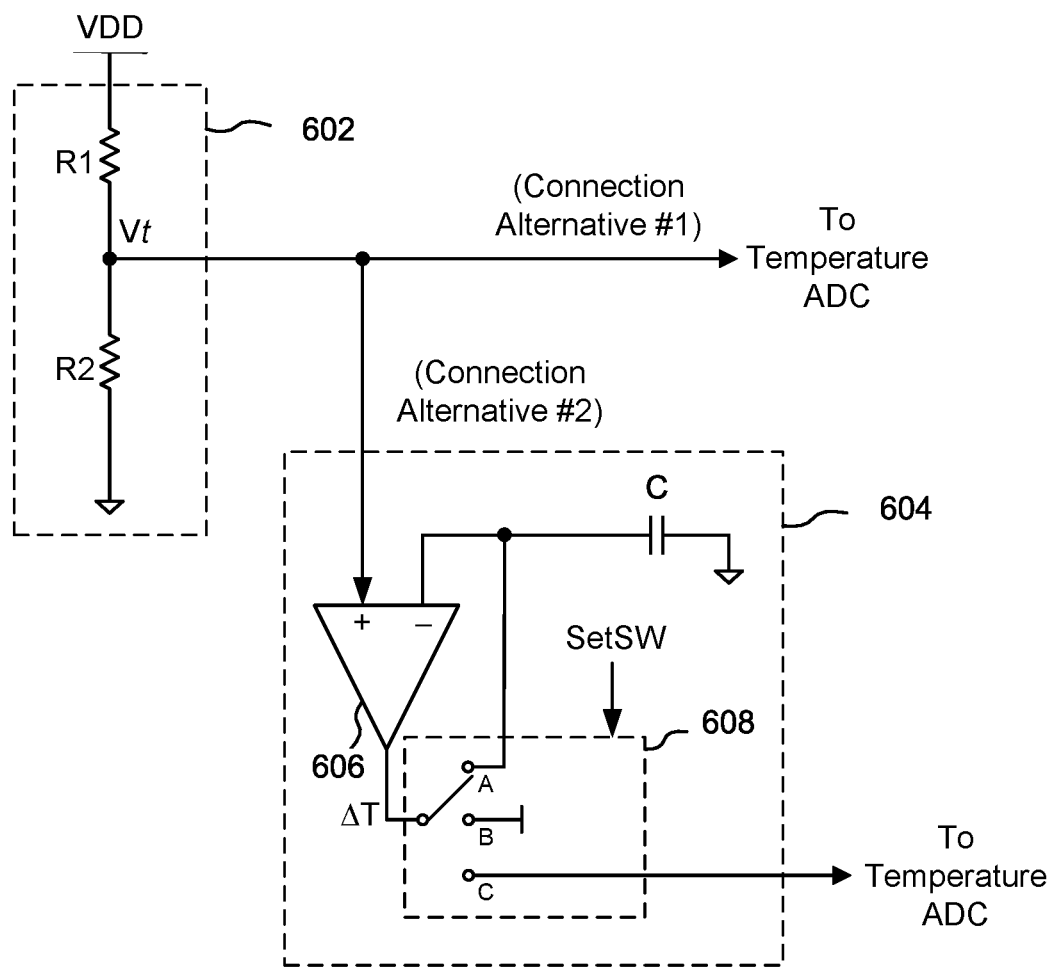
FIG. 6 is a schematic diagram of one embodiment of an analog temperature sensor circuit that may be used as an auxiliary temperature sensor.

Alternative circuits may be used for the local temperature sensor 508. For example, FIG. 6 is a schematic diagram of one embodiment of an analog temperature sensor circuit 600 that may be used as a local temperature sensor 508. The temperature sensor circuit 600 includes a temperature-sensitive subcircuit 602 comprising two series-coupled resistors R1, R2 coupled between a voltage supply $V_{DD}$ and circuit ground. The values of one or both of the resistors R1, R2 may be adjustable or settable (e.g., by laser trimming during manufacture) or variable (e.g., by a programmed control signal from signal processing circuitry within the IC die 500). If the resistors R1, R2 are fabricated in reasonably close proximity to another circuit element (e.g., the capacitor terminals 110, 112), the node between the resistors R1, R2 will have a voltage Vt that varies as a function of the temperature of the nearby circuit element. As should be clear, a different temperature subcircuit could be used in place of the illustrated resistor-based temperature-sensitive subcircuit 602, such as a diode-based temperature-sensitive subcircuit or subcircuit comprising a negative-temperature-coefficient (NTC) thermistor series-coupled to a resistor. In some embodiments, the voltage Vt output by the temperature-sensitive subcircuit 602 may be coupled to a temperature analog-to-digital converter (ADC), either directly if there is only one temperature sensor circuit 600 or through a multiplexor (not shown) if there is more than one temperature sensor circuit 600. The output of the ADC may be used, for example, to select a value in a look-up table that provides a mapped temperature value corresponding to the sensed analog voltage Vt. Such a mapping may be determined, for example, during characterization of IC samples of a particular IC design.

In other embodiments, the voltage Vt output by the temperature-sensitive subcircuit 602 may be first coupled to a sample-and-hold (S&H) circuit 604. For example, a S&H circuit 604 may be used to sample the temperature at one or more locations within a sensor IC die before the resistive heating elements 506a, 506b are turned ON, and then measure the change in temperature after the resistive heating elements 506a, 506b are turned ON.

In the example circuit illustrated in FIG. 6, the voltage Vt is coupled to a first input of a differential amplifier 606 which may be, for example, a differential transconductance amplifier (however, other circuits may be used that can generate an output that is a function of the difference between two provided inputs). The output of the differential amplifier 606 is coupled to a 3-terminal switch 608 that may be implemented with field effect transistors (FETs), particularly MOSFETs. Terminal A of the switch 608 is coupled to a charge storage capacitor C and to a second input of the differential amplifier 606. Terminal B is an open circuit, and terminal C may be directly or indirectly coupled, for example, to a temperature ADC (see FIGS. 7 and 8). The state of the switch 608 may be set by a timing control signal SetSW from signal processing circuitry within the IC die 500.

In operation, during a sampling interval, the timing control signal SetSW sets the switch 608 of the S&H circuit 604 to couple the output of the differential amplifier 606 to terminal A as an initial sampling state. As a consequence, the capacitor C will be charged up until both inputs to the differential amplifier 606 are equal to Vt, the voltage representing the momentary temperature of a circuit element being monitored (i.e., nearby the temperature-sensitive subcircuit 602). More precisely, for the case where the differential amplifier 606 is a transconductance amplifier, the voltage on the positive input will be Vt, but the voltage on the negative input (and on the capacitor C) will be the combination of Vt and the inverse of the cumulative offsets (imbalances) in the differential amplifier 606 required to set its output current to zero (once the voltage on the capacitor C settles to a static value, no current can flow). Accordingly, the S&H circuit 604 in effect calibrates out all of its offsets during the sampling phase, and the capacitor C is in essence constantly tracking the temperature of the circuit element being monitored.

After a short delay (e.g., about 5-10 μS), the timing control signal SetSW sets the switch 608 of the S&H circuit 604 to couple the output of the differential amplifier 606 to terminal B, and thus uncouple the capacitor C from any further input from the differential amplifier 606; the transition to terminal B provides a non-overlapping switching sequence to reduce sampling errors. At the time $t=t_0$ that the timing control signal SetSW activates terminal B, the capacitor C holds a charge that represents the temperature $T(t=t_0)$ of the circuit element being monitored (as well as any associated S&H circuit 604 offsets, so as to effectively dynamically calibrate out such offsets as noted above). Thus, coupling the output of the differential amplifier 606 to terminal B for a brief (e.g., 0.1-1 μS) transition period allows the circuitry to settle to a new state, thereby avoiding transients in other circuitry while holding a sampled charge on the capacitor C.

Thereafter, the timing control signal SetSW sets the switch 608 to couple the output of the differential amplifier 606 to terminal C for a time $t>t_0$ (i.e., a time after $t_0$). When the S&H circuit 604 is in this configuration, one input of the differential amplifier 606 is the stored charge (voltage) on the capacitor C, representing the temperature $T(t=t_0)$, while the other input of the differential amplifier 606 is Vt, representing the temperature $T(t>t_0)$—that is, the continuously measured temperature of the circuit element being monitored. The output of the differential amplifier 606 is ΔT, which represents the difference between the initial temperature $T(t=t_0)$ and the subsequently measured temperature $T(t>t_0)$ of the circuit element being monitored. As should be clear, other sample and hold circuits may be used to determine $\Delta T=T(t>t_0)-T(t=t_0)$ for the circuit element being monitored.

C. Remote Temperature Sensors

A third embodiment is an implementation of the second approach referenced above. In the third embodiment, with different heat levels applied, a range of temperature levels around the capacitor terminals 110, 112 is directly measured during characterization of IC samples of a particular IC design (i.e., a local measurement with respect to the capacitor terminals 110, 112). The real time temperature increase of the capacitor structure 504 may be measured, for example, by laboratory temperature sensors (thus, no temperature sensors and accompanying circuitry need be added to the IC 500 at the same level as the capacitor structure 504).

In addition, referring to FIG. 5, one or more remote temperature sensors 510a, 510b may be fabricated on or in the primary circuit layer 104 level and/or the superstructure level 106. The remote temperature sensors 510a, 510b may be, for example, configured like the temperature sensor circuit 600 shown in FIG. 6. Mapping the difference between the local measurements and the remote measurements (for example, by curve fitting or using a LUT) enables the use of one or more remote temperature sensors to estimate the temperature around the capacitor terminals 110, 112 in real time during IC operation based on the local temperatures around the capacitor terminals 110, 112 measured during characterization.

Figure 7A:
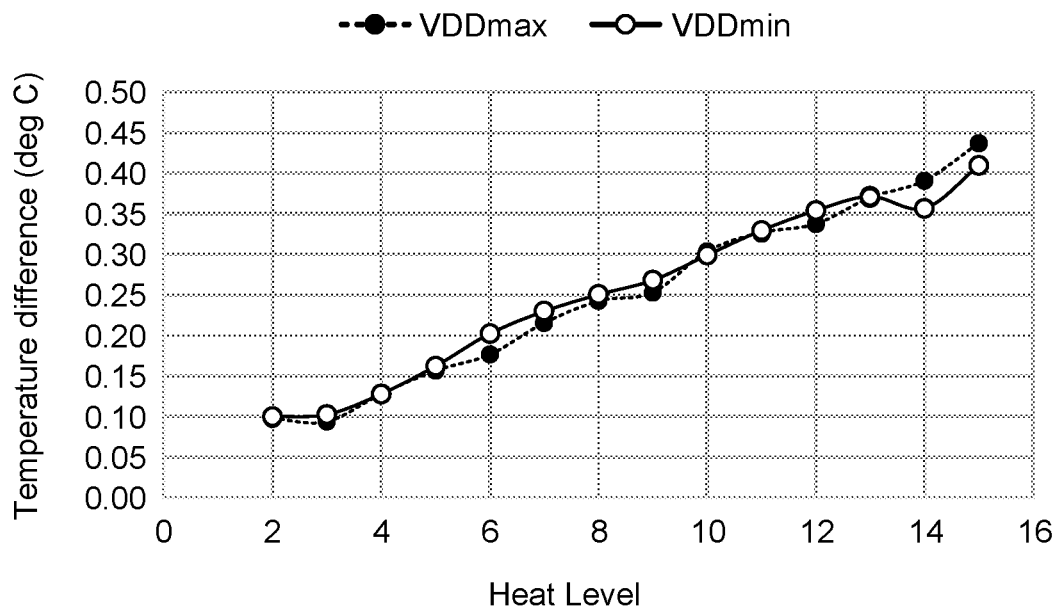
FIG. 7A is a graph, for an example IC humidity sensor, of the difference between the locally measured temperature around the capacitor terminals and the temperature as measured by a remote temperature sensor versus various selected heat levels, at two different supply voltage levels (VDDmax and VDDmin) and at an ambient temperature of 40° C.
Figure 7B:
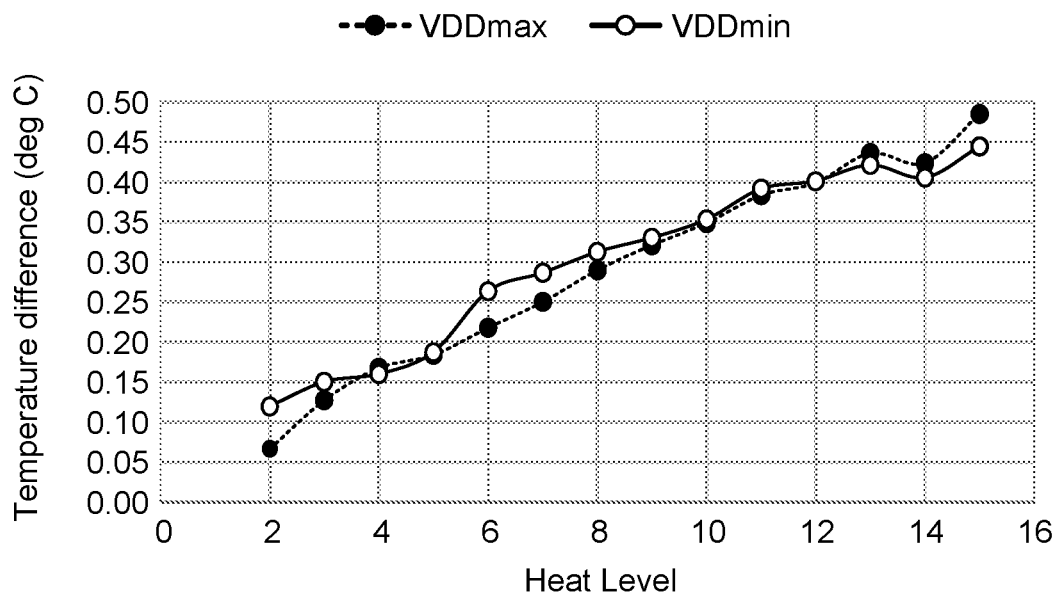
FIG. 7B is a graph, for an example IC humidity sensor, of the difference between the locally measured temperature around the capacitor terminals and the temperature as measured by a remote temperature sensor versus various selected heat levels, at two different supply voltage levels (VDDmax and VDDmin) and at an ambient temperature of −20° C.

The temperature rise at the remote temperature sensors 510a, 510b is less than the temperature rise around the capacitor terminals 110, 112. FIG. 7A is a graph, for an example IC humidity sensor, of the difference between the locally measured temperature around the capacitor terminals 110, 112 and the temperature as measured by a remote temperature sensor versus various selected heat levels, at two different supply voltage levels (VDDmax and VDDmin) and at an ambient temperature of 40° C. FIG. 7B is a graph, for an example IC humidity sensor, of the difference between the locally measured temperature around the capacitor terminals 110, 112 and the temperature as measured by a remote temperature sensor versus various selected heat levels, at two different supply voltage levels (VDDmax and VDDmin) and at an ambient temperature of −20° C. As the graphs in FIGS. 7A and 7B show, there is essentially a linear relationship of temperature difference as a function of applied heat level that is essentially independent of voltage supply and ambient temperature, thus validating the second approach referenced above.

Accordingly, the remote temperature sensors 510a, 510b can be calibrated to estimate the temperature increase of the capacitor structure 504 in real time based on the characterized actual temperature of the capacitor-based environmental sensor as measured in laboratory samples, without having to actually measure the temperature increase of the capacitor structure 504 in real time (thus avoiding adding real-time measurement sensors at the level of the capacitor structure 504).

Correction of Non-Linearity

As noted above, if the amount of temperature increase of a humidity sensor is known, an offset or correction to the measured humidity value can be calculated to yield a value that represents the ambient humidity to improve linearity. The same principle applies to other types of sensors (e.g., chemical or biological) where the linearity of the sensors can be extended or corrected by heating the sensor within some range of operation.

For example, one curve fitted to the plotted points in FIG. 3 yields an equation: $y=408.51e^{-0.041x}$, where x is temperature and y is relative humidity. If a known transition point from linear to non-linear behavior of the capacitor structure 504 in FIG. 5 is at 80% measured humidity, the heating elements 506a, 506b may be turned on to some desired level at the transition point. Using the measured temperature rise near the capacitor terminals 110, 112 in the curve fitting formula for FIG. 3 determines a quite good estimate of the temperature-induced change in measured relative humidity by the capacitor structure 504.

For example, if heating of the capacitor structure 504 is initiated when the capacitor structure 504 and associated processing circuitry reports 80% measured humidity, and the temperature around the capacitor structure 504 is then measured as 45° C., the measured relative humidity will be artificially forced down to about 64.6% from 80% (applying the equation from above). Notably, 64.6% is within the linear range of the capacitor structure 504. Accordingly, nominal humidity readings from the capacitor structure 504 would be adjusted upwards by 15.4% to provide a close estimate of actual ambient humidity level. For example, while in the region of non-linear behavior of the capacitor structure 504, if the capacitor structure 504 provides a nominal humidity reading of 70%, the corrected estimate of the actual ambient humidity level would be 85.4%. The corrections may be performed, for example, by signal processing circuitry within the IC die 500, such as the digital signal processor 802 shown in FIG. 8.

The heating elements 506a, 506b may be turned off when the heated capacitor structure 504 reports a nominal humidity level less than the initial value reported after the heating elements 506a, 506b where turned on (e.g., below 64.6% in the above example). Alternatively, a second, non-compensated capacitor structure 504 may be used to detect transitions between linear and non-linear behavior (e.g., transitions across 80% measured humidity).

Multiple Sensors

Figure 8:
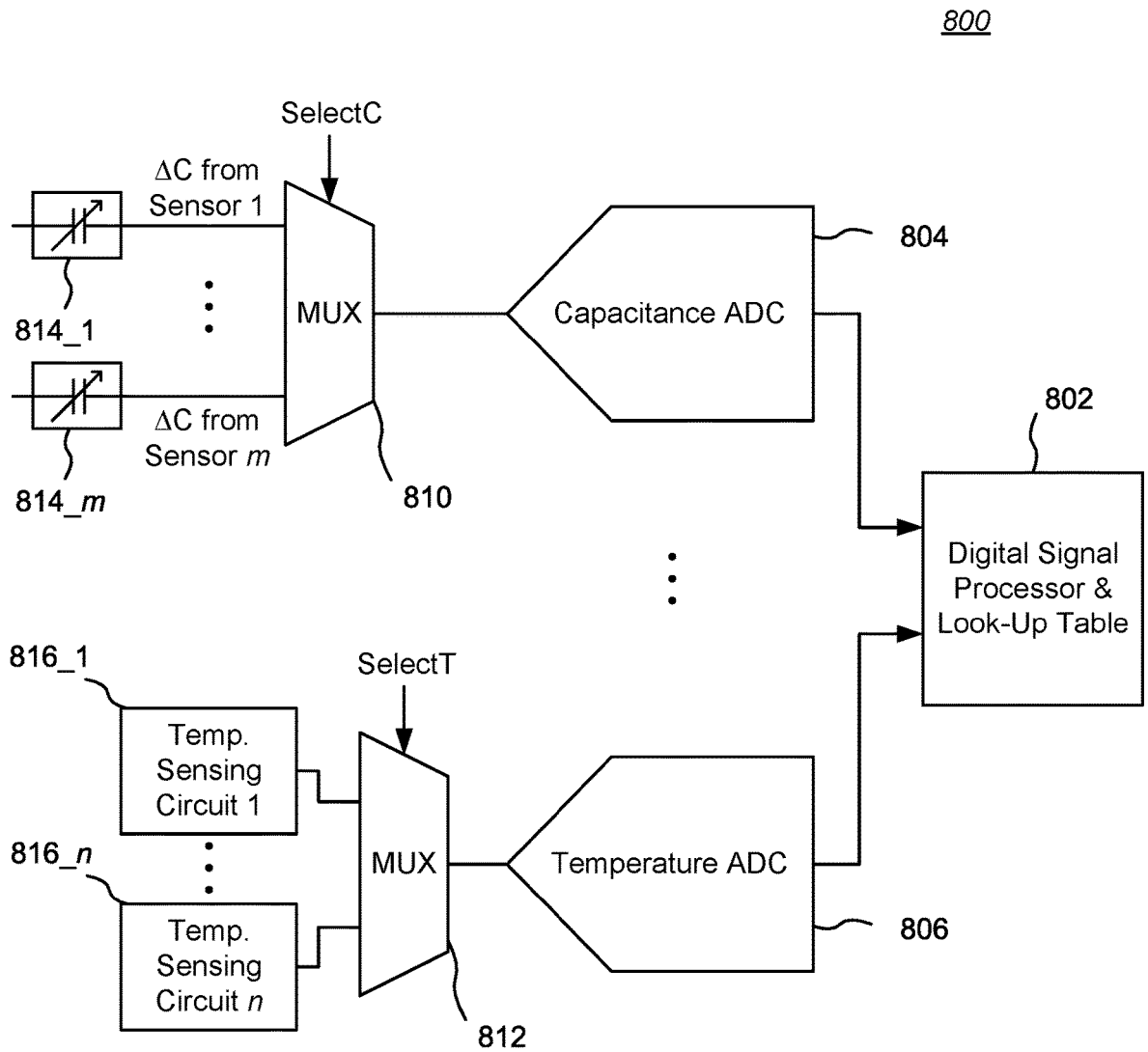
FIG. 8 is a block diagram of one embodiment of a multiplexor circuit that may be fabricated as part of an IC die.

As noted above, from a measured local temperature and a known transition point from linear to non-linear behavior of the capacitor structure 504, a selected amount of added heat may be applied around the capacitor terminals 110, 112 to linearize the measurements of the capacitor structure 504. If desired, multiple capacitor structures 504 may be implemented on the same IC die and configured to sense one or more environmental characteristics (e.g., humidity levels, chemical presence and/or concentrations, biological molecules presence and/or concentrations, etc.). The sensor inputs may be multiplexed into the same data converter and processed by the same digital signal processor, providing a significant reduction of IC area. For example, FIG. 8 is a block diagram of one embodiment of a multiplexor circuit 800 that may be fabricated as part of an IC die 500. A digital signal processor 802, which generally would be part of signal processing circuitry within the IC die 500, is configured to receive inputs from at least one capacitance analog-to-digital converter (ADC) 804 and from at least one temperature ADC 806, and generate and output a response based on the received inputs. The generated response may be, for example, a value that can be mapped to a displayable value (e.g., a humidity reading) or a value that can be used to control other on-chip circuitry or off-chip circuits or elements, in known fashion. In the case of generated temperature values, such temperature values may be used to control the temperature of the heating elements 506a, 506b and/or to control correction of the non-linearity of one or more capacitor structures 504.

Each ADC 804, 806 is configured to convert an analog input to a digital signal, in known fashion. The capacitance ADC 804 would be configured and calibrated to receive an analog signal from a capacitor structure 504 indicative of a change in capacitance, $\Delta C$, and convert the received analog signal to a corresponding $\Delta C$ digital signal. Similarly, the temperature ADC 806 would be configured and calibrated to receive an analog signal from a temperature sensor circuit (e.g., like the circuit of FIG. 6) indicative of a change in temperature, $\Delta T$, and convert the received analog signal to a corresponding $\Delta T$ digital signal. Different signal ranges of the input signals to the ADC's 804, 806 can be accounted for in the dynamic range of the ADC's 804, 806, and/or appropriate gain partitioning in the system, and/or by scaling the inputs as needed (e.g., with a voltage divider circuit and/or amplifier circuit, in known fashion).

If more than one signal needs A-D conversion, then one or more multiplexors 810, 812 may be used before the input terminal of a particular ADC 804, 806, allowing output signals from one of a plurality of analog circuits to be selectively coupled to a corresponding ADC 804, 806 under the control of a corresponding selection signal. For example, in the illustrated embodiment, which input to the multiplexor 810 is passed through as an output of the multiplexor 810 is controlled by a SelectC signal; similarly, which input to the multiplexor 812 is passed through as an output of the multiplexor 812 is controlled by a SelectT signal. The selection signals SelectC, SelectT may be generated by signal processing circuitry within the IC die 500, and, for example, may be simple "round-robin" signals that cycle through the possible inputs in a desired order. In other cases, the selection signals SelectC, SelectT may be generated in response to some criteria internal to signal processing circuitry within the IC die 500, such as a known transition point from linear to non-linear behavior of a capacitor structure 504.

In the example embodiment shown in FIG. 8, a first multiplexor 810 is coupled between the capacitance ADC 804 and $\Delta C$ output signals from a plurality of capacitor-based sensors 814_1 ... 814_m (collectively, 814_x), represented symbolically as variable capacitors. One or more of the capacitor-based sensors 814_x may be, for example, like the capacitor structure 504 shown in FIG. 5 and fully integrated with the IC die 500. In addition, one or more of the capacitor-based sensors 814_x may be external to the IC die 500, such as a capacitance-based pressure sensor die (not shown).

A second multiplexor 812 is coupled between the temperature ADC 806 and $\Delta T$ output signals from a plurality of temperature-sensitive sensors 816_1 ... 816_n (collectively, 816_x). One or more of the temperature-sensitive sensors 816_x may be fully integrated with the IC die 500 (e.g., like the circuit of FIG. 6). One or more of the temperature-sensitive sensors 816_x also may be external to the IC die 500, such as from a power management integrated circuit (PMIC, not shown) coupled to the IC die 500.

Heater Control

Figure 9:
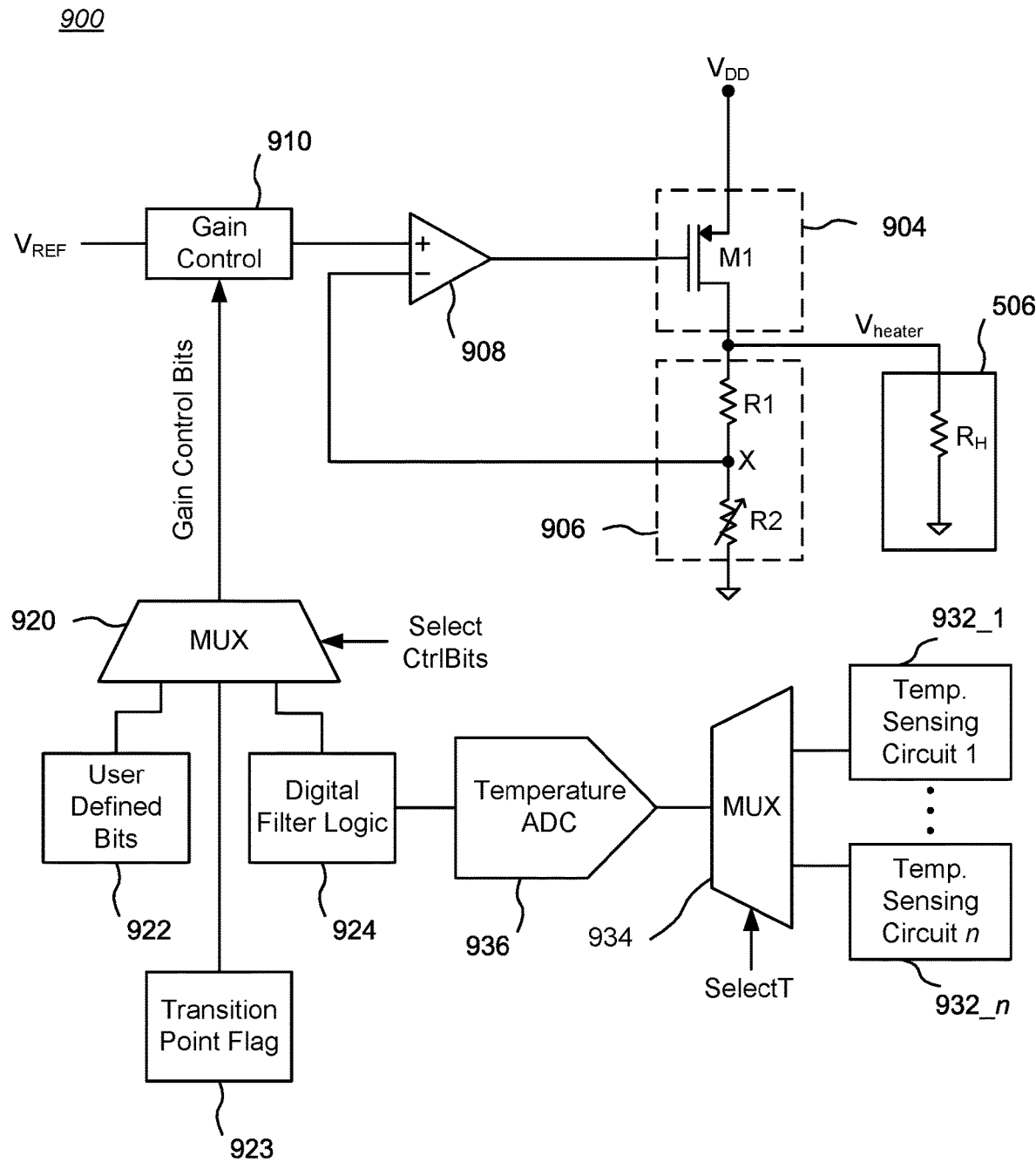
FIG. 9 is a block diagram of one embodiment of an integrated circuit heating element and control circuit.

FIG. 9 is a block diagram of one embodiment of an integrated circuit heating element and control circuit 900. The heating element and control circuit 900 may be fabricated as part of an IC die 500. In the illustrated example, a heating element 506 (which may comprise, for example, a resistor $R_H$) is coupled to a first terminal of a switch device 904 (shown as a PMOS field effect transistor M1) and a first terminal of a voltage scaling circuit 906. A second terminal of the switch device 904 is configured to be coupled to a supply voltage $V_{DD}$. A second terminal of the voltage scaling circuit 906 is configured to be coupled to circuit ground. An embodiment may include one or more heating elements 506 (see, for example, FIG. 5).

In the example shown in FIG. 9, the voltage scaling circuit 906 is a resistive divider comprising series-coupled resistors R1, R2 coupled between the switch device 904 and circuit ground. The values of one or both of the resistors R1, R2 may be adjustable or settable (e.g., by laser trimming during manufacture) or variable (e.g., by a programmed control signal from the signal processing circuitry within the IC die 500). A scaled voltage output of the voltage scaling circuit 906 is also coupled to a first input of an amplifier 908, which may be, for example, a differential amplifier. In the illustrated example, the scaled voltage output of the voltage scaling circuit 906 is a node X between the series-coupled resistors R1, R2. The ratio of the resistors R1, R2 will determine the amount of the voltage coming through the switch device 904 that will be applied to the first input of the amplifier 908.

A second input of the amplifier 908 is coupled to a conventional gain control circuit 910, which is in turn coupled to a reference voltage $V_{REF}$. The reference voltage $V_{REF}$ preferably provides a well-regulated, temperature-independent voltage. For example, the reference voltage $V_{REF}$ may be generated by a conventional bandgap voltage reference circuit (not shown).

The gain control circuit 910 provides fine control of the voltage applied to the second input of the amplifier 908 under the control of applied Gain Control Bits, in known fashion. As an example, four Gain Control Bits would allow any of 16 voltage levels to be selected, while eight Gain Control Bits would allow any of 256 voltage levels to be selected. In general, one value for the Gain Control Bits should cause the amplifier 908 to turn the switch device 904 OFF, so that no appreciable current flows through the heating element 506. In the illustrated example, the Gain Control Bits provided to the gain control circuit 910 may be selected by a multiplexor 920 from external user supplied control bits 922, or from an internally-generated Transition Point Flag 923 (indicating a known transition point from linear to non-linear behavior of a capacitor structure 504), or from a digital filter logic circuit 924 (see further description below). A SelectCtrlBits signal, which may be from signal processing circuitry within the IC die 500, controls which input to the multiplexor 920 is passed through as an output of the multiplexor 920 to the gain control circuit 910.

The output of the amplifier 908 is coupled to a control input of the switch device 904 (e.g., the gate of transistor M1). The output of the amplifier 908 controls current flow through the switch device 904 as a function of the difference between a feedback voltage generated by the voltage scaling circuit 906 (e.g., the voltage at node X) and $V_{REF}$, as selectively scaled by the gain control circuit 910. Accordingly, the amplifier 908 regulates the current through any coupled heating elements 506 by forcing a voltage $V_{heater}$ across the heating element 506 through a feedback loop.

When more than one heating element 506 is used, as in the embodiment of FIG. 5, it may be beneficial to insert a multiplexor (not shown) between the switch device 904 and the plurality of heating elements 506 so that only one heating element 506 is coupled to the switch device 904 at a time. Alternatively, the control circuitry shown in FIG. 9 for the single illustrated heating element 506 may be replicated for each additional heating element 506.

The heating element and control circuit 900 of FIG. 9 should be configured to provide a high correlation between Gain Control Bit value and temperature. The heater current through the heating element 506 varies inversely with respect to temperature. Thus, the higher the Gain Control Bit value, the more current is allowed through the switch device 904 to the heating element 506, which means that the temperature of the heating element 506 is reduced. For example, the resistance of aluminum, a common IC conductive material, increases with temperature.

The heating element and control circuit 900 of FIG. 9 also includes a digital closed loop control circuit to achieve a desired temperature rise. For example, one or more temperature-sensitive sensors 932_1 . . . 932_n (collectively, 932_x) are coupled through an optional multiplexor 934 (only needed if more than one temperature-sensitive sensor 932_x is used) to a temperature ADC 936. One or more of the temperature-sensitive sensors 932_x may be like the circuit of FIG. 6. The output of the temperature ADC 936 is coupled to the digital filter logic circuit 924 mentioned above. The digital filter logic circuit 924 may provide a number of filtering functions such as averaging a set of temperature signals from one or more of the temperature-sensitive sensors 932_x and/or omitting values that are deemed to be spurious (e.g., extremely high or low temperature readings that may be due to electronic noise). The digital filter logic circuit 924 may also apply a mapping function that maps digital temperature values from the temperature ADC 936 to Gain Control Bits. Through a calibration process, which may include circuit modeling and/or actual characterization or unit testing of IC dies, a determination can be made of the Gain Control Bit values needed to achieve a desired temperature rise for a local region around a heater element 506.

Methods

Figure 10:
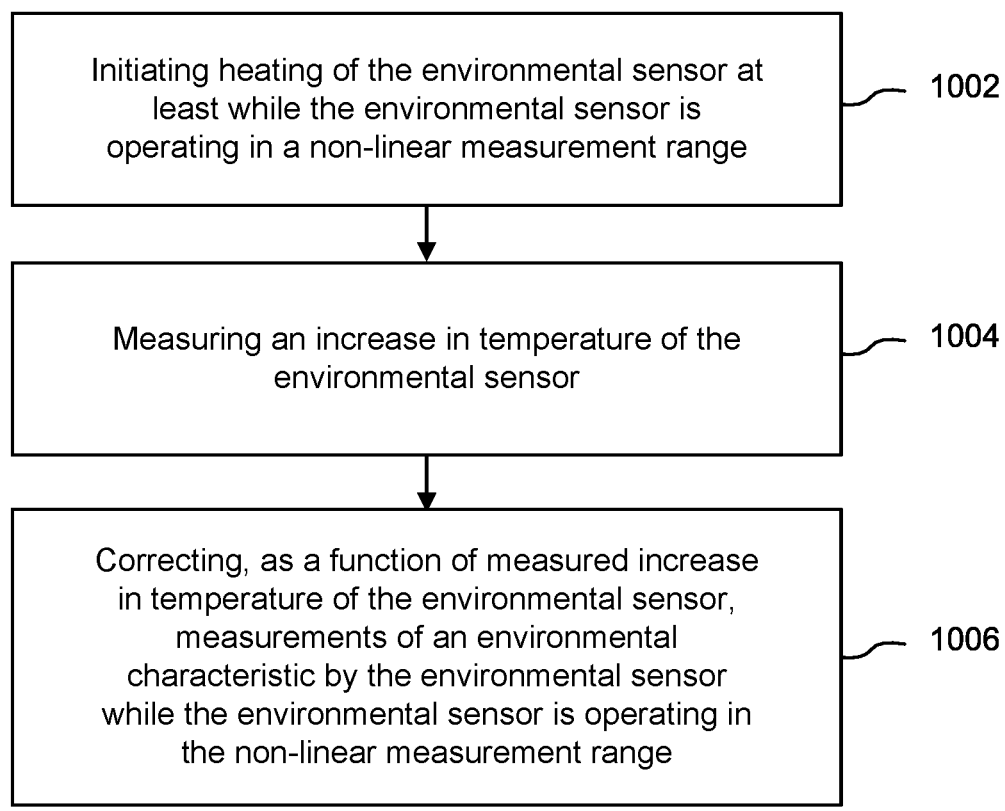
FIG. 10 is a process flow chart showing one method for extending the linear range of an integrated circuit environmental sensor, such as a humidity circuit.

Another aspect of the invention includes methods for extending the linear range of an integrated circuit environmental sensor. For example, FIG. 10 is a process flow chart 1000 showing one method for extending the linear range of an integrated circuit environmental sensor, such as a humidity circuit. The method includes: A method of extending the linear range of an integrated circuit environmental sensor, including: initiating heating of the environmental sensor at least while the environmental sensor is operating in a non-linear measurement range (Block 1002); measuring an increase in temperature of the environmental sensor (Block 1004); and correcting, as a function of measured increase in temperature of the environmental sensor, measurements of an environmental characteristic by the environmental sensor while the environmental sensor is operating in the non-linear measurement range (Block 1004).

Additional aspects of the above method may include one or more of the following: wherein the environmental sensor includes a first capacitor terminal, a second capacitor terminal in spaced relationship with respect to the first capacitor terminal, and an environmentally sensitive dielectric material formed between, and optionally around, the first and second capacitor terminals as a dielectric, the environmentally sensitive dielectric material being responsive to a selected environmental characteristic so as to cause a measurable change in electrical capacitance and/or charge across the capacitor structure; wherein the environmentally sensitive dielectric material is responsive to humidity levels; wherein the environmentally sensitive dielectric material is responsive to one or more specific chemicals; wherein the environmentally sensitive dielectric material is responsive to one or more specific biological molecules; further including forming the environmental sensor as part of a first layer of the integrated circuit and forming a temperature sensor as part of a second layer of the integrated circuit spaced from the first layer; further including calibrating the temperature sensor to estimate the temperature increase of the environmental sensor based on a previous characterization of the actual temperature of the environmental sensor; further including forming the environmental sensor as part of a first layer of the integrated circuit, and forming a temperature sensor as part of the first layer; and/or further including forming the environmental sensor as part of a first layer of the integrated circuit, forming a heating element is part of the first layer of the integrated circuit, and utilizing the heating element as part of a temperature sensor.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

With respect to the figures referenced in this disclosure, particularly of integrated circuit structures, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as "smart" cellphones and watches, thermostats, heating/ventilating/air conditioning systems (HVAC systems), automobiles, refrigerators, and other applications where knowledge of humidity, chemical, and/or biological molecule levels is useful.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An integrated circuit die including:
   (a) an environmental sensor having a linear measurement range and a non-linear measurement range;
   (b) a heating element positioned to initiate heating of the environmental sensor at least while the environmental sensor is operating in the non-linear measurement range and maintain heating of the environmental sensor while measurements are made;
   (c) a temperature sensor positioned to measure an increase in temperature of the environmental sensor while measurements are made, the temperature sensor including:
      (1) a temperature-sensitive subcircuit including two resistors, coupled in series and configured to be coupled between a voltage supply and a reference potential, and a node configured to output a voltage $V_t$ that varies as a function of temperature, wherein the node is located between the two resistors; and
      (2) a sample-and-hold circuit having an input coupled to the node between the two resistors of the temperature-sensitive subcircuit and configured to output a signal $\Delta T$ indicative of a difference between a first temperature indicated by the voltage $V_t$ at a first time and a second temperature indicated by the voltage $V_t$ at a subsequent second time; and
   (d) circuitry, coupled to the temperature sensor, heating element, and the environmental sensor, configured to:
      (1) initiate heating of the environment sensor when the environment sensor is operating in the non-linear measurement range, thereby causing the environment sensor to operate in the linear measurement range;
      (2) receive the voltage $V_t$ and measurement values output by the environment sensor;
      (3) adjust, as a function of measured increase in temperature of the environmental sensor as represented by the voltage $V_t$, the linear measurement values output by the environment sensor while operating in the non-linear measurement range to provide measurements of an environmental characteristic by the environmental sensor representing a corrected measurement corresponding to the non-linear measurement range.

2. The invention of claim 1, wherein the environmental sensor includes
(a) a first capacitor terminal;
(b) a second capacitor terminal in spaced relationship with respect to the first capacitor terminal; and
(c) an environmentally sensitive dielectric material formed between, and optionally around, the first and second capacitor terminals as a dielectric, the environmentally sensitive dielectric material being responsive to a selected environmental characteristic so as to cause a measurable change in electrical capacitance and/or charge across the capacitor structure.

3. The invention of claim 2, wherein the environmentally sensitive dielectric material is responsive to humidity levels.

4. The invention of claim 2, wherein the environmentally sensitive dielectric material is responsive to one or more specific chemicals.

5. The invention of claim 2, wherein the environmentally sensitive dielectric material is responsive to one or more specific biological molecules.

6. The invention of claim 2, wherein a response of the environmentally sensitive dielectric material is sensitive to temperature changes.

7. The invention of claim 1, wherein the environmental sensor is formed as part of a first layer of the integrated circuit die and the temperature sensor is fabricated as part of a second layer of the integrated circuit die spaced from the first layer.

8. The invention of claim 7, wherein the temperature sensor fabricated as part of the second layer of the integrated circuit die is calibrated to estimate the temperature increase of the environmental sensor based on a previous characterization of the actual temperature of the environmental sensor.

9. The invention of claim 1, wherein the environmental sensor is formed as part of a first layer of the integrated circuit die, and the temperature sensor is fabricated as part of the first layer.

10. The invention of claim 1, wherein the heating element is part of the temperature sensor.

11. An integrated circuit die including:
(a) a capacitor-based environmental sensor formed as part of the integrated circuit die;
(b) a heating element positioned to heat the capacitor-based environmental sensor and configured to initiate heating of the capacitor-based environmental sensor while the capacitor-based environmental sensor is operating in a non-linear measurement range and maintain heating of the environmental sensor while measurements are made;
(c) a temperature sensor positioned to measure an increase in temperature of the capacitor-based environmental sensor while measurements are made, the temperature sensor including:
  (1) a temperature-sensitive subcircuit including two resistors, coupled in series and configured to be coupled between a voltage supply and a reference potential, and a node configured to output a voltage $V_t$ that varies as a function of temperature, wherein the node is located between the two resistors; and
  (2) a sample-and-hold circuit having an input coupled to the node between the two resistors of the temperature-sensitive subcircuit and configured to output a signal $\Delta T$ indicative of a difference between a first temperature indicated by the voltage $V_t$ at a first time and a second temperature indicated by the voltage $V_t$ at a subsequent second time; and
(d) a signal processor coupled to the temperature sensor, heating element, and the capacitor-based environmental sensor, the signal process configured to:
  (1) initiate heating of the capacitor-based environment sensor when the capacitor-based environment sensor is operating in the non-linear measurement range, thereby causing the capacitor-based environment sensor to operate in the linear measurement range;
  (2) adjust, as a function of measured increase in temperature of the capacitor-based environmental sensor as represented by the voltage $V_t$, the linear measurement values output by the capacitor-based environment sensor while operating in the non-linear measurement range to provide measurements of an environmental characteristic by the capacitor-based environmental sensor representing a corrected measurement corresponding to the non-linear measurement range.

12. The invention of claim 11, wherein the capacitor-based environmental sensor includes
(a) a first capacitor terminal;
(b) a second capacitor terminal in spaced relationship with respect to the first capacitor terminal; and
(c) an environmentally sensitive dielectric material formed between, and optionally around, the first and second capacitor terminals as a dielectric, the environmentally sensitive dielectric material being responsive to a selected environmental characteristic so as to cause a measurable change in electrical capacitance and/or charge across the capacitor structure.

13. The invention of claim 12, wherein the environmentally sensitive dielectric material is responsive to humidity levels.

14. The invention of claim 12, wherein the environmentally sensitive dielectric material is responsive to one or more specific chemicals.

15. The invention of claim 12, wherein the environmentally sensitive dielectric material is responsive to one or more specific biological molecules.

16. The invention of claim 12, wherein a response of the environmentally sensitive dielectric material is sensitive to temperature changes.

17. The invention of claim 11, wherein the capacitor-based environmental sensor is formed as part of a first layer of the integrated circuit die and the temperature sensor is fabricated as part of a second layer of the integrated circuit die spaced from the first layer.

18. The invention of claim 17, wherein the temperature sensor fabricated as part of the second layer of the integrated circuit die is calibrated to estimate the temperature increase of the capacitor-based environmental sensor based on a previous characterization of the actual temperature of the capacitor-based environmental sensor.

19. The invention of claim 11, wherein the capacitor-based environmental sensor is formed as part of a first layer of the integrated circuit die, and the temperature sensor is fabricated as part of the first layer.

20. The invention of claim 11, wherein the heating element is part of the temperature sensor.

* * * * *